(12) United States Patent
Jain et al.

(10) Patent No.: US 12,244,317 B2
(45) Date of Patent: Mar. 4, 2025

(54) CML TO CMOS CONVERSION CIRCUIT, RECEIVER CIRCUIT AND CONVERSION METHOD THEREOF

(71) Applicant: Faraday Technology Corp., Hsinchu (TW)

(72) Inventors: Vinod Kumar Jain, Hsinchu (TW); Mikhail Tamrazyan, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 18/351,513

(22) Filed: Jul. 13, 2023

(65) Prior Publication Data
US 2025/0023559 A1 Jan. 16, 2025

(51) Int. Cl.
*H03K 5/24* (2006.01)
*H03F 1/32* (2006.01)
*H03F 3/45* (2006.01)

(52) U.S. Cl.
CPC ......... *H03K 5/2481* (2013.01); *H03F 1/3211* (2013.01); *H03F 3/45183* (2013.01); *H03F 3/45273* (2013.01); *H03F 2203/45116* (2013.01)

(58) Field of Classification Search
CPC . H03K 5/2481; H03F 1/3211; H03F 3/45183; H03F 3/45273; H03F 2203/45116; H03F 1/3205; H03F 3/45179; H03F 3/45188
See application file for complete search history.

(56) References Cited

U.S. PATENT DOCUMENTS

| 7,061,273 B2 | 6/2006 | Wang et al. |
| 8,749,269 B2 | 6/2014 | Cao |
| 9,843,324 B1 | 12/2017 | Hafizi et al. |
| 11,190,172 B1 * | 11/2021 | Raj ................ H03K 19/018521 |
| 2023/0198510 A1 | 6/2023 | Whitcombe et al. |

OTHER PUBLICATIONS

"Office Action of Taiwan Counterpart Application", issued on Oct. 7, 2024, p. 1-p. 8.

* cited by examiner

*Primary Examiner* — Jung Kim
(74) *Attorney, Agent, or Firm* — JCIPRNET

(57) ABSTRACT

A conversion circuit includes a replica feedback loop circuit and a CML to CMOS converter. The replica feedback loop circuit of a conversion circuit includes a first inverter, a first-stage amplifier and a second-stage amplifier. An input terminal of the first inverter is shorted to an output terminal of the first inverter. The second-stage amplifier of the replica feedback loop circuit is a replica of a half of a differential amplifier of the CML to CMOS converter. The replica feedback loop circuit is configured to generate a bias voltage that is used to bias the differential amplifier of the CML to CMOS converter, such that a common mode (CM) voltage outputted by the differential amplifier is same as a switching threshold voltage of a second inverter of the CML to CMOS converter.

11 Claims, 5 Drawing Sheets

CML TO CMOS CONVERSION CIRCUIT, RECEIVER CIRCUIT AND CONVERSION METHOD THEREOF

BACKGROUND

Technical Field

The disclosure relates to a current mode logic (CML) to complementary metal oxide semiconductor (CMOS) conversion that is capable of converting a CML signal to a CMOS signal with high gain, high bandwidth and low jitter.

Description of Related Art

In a communication system such as a passive optical network system, a transmitter may communicate with a receiver via a channel. The receiver may include a continuous time linear equalization (CTLE) circuit and a voltage-controlled oscillator (VCO) circuit, in which the CTLE circuit outputs current mode logic (CML) signal while the VCO circuit operates based on complementary metal oxide semiconductor (CMOS) signal. A CML to CMOS conversion circuit may be required to convert the CML signal to the CMOS signal.

However, a conversion operation of a conventional CML to CMOS conversion circuit may suffer from the problems of low gain, low bandwidth and data jitter.

SUMMARY

The disclosure introduces a conversion circuit, a receiver circuit and a conversion method that is capable of converting a CML signal to a CMOS signal with high gain, high bandwidth and low jitter.

In some embodiments, a conversion circuit includes a replica feedback loop circuit and a CML to CMOS converter. The replica feedback loop circuit includes a first inverter having a switching threshold voltage and is configured to generate a bias voltage based on the switching threshold voltage of the first inverter. An input terminal of the first inverter is electrically connected to an output terminal of the first inverter. The CML to CMOS converter is coupled to the replica feedback loop circuit and is configured to convert a CML signal to a CMOS voltage based on the bias voltage. The CML to CMOS converter includes a second inverter having a switching threshold voltage that is same as the switching threshold voltage of the first inverter of replica feedback loop circuit. The bias voltage is configured to set a common-mode (CM) voltage that is input to the second inverter of the CML to CMOS converter to be same as the switching threshold voltage of the second inverter.

In some embodiments, a receiver circuit includes a continuous time linear equalization (CTLE) circuit and a conversion circuit. The CTLE circuit is configured to generate a first CML signal, a second CML signal and a direct current (DC) CML signal. The conversion circuit is coupled to the CTLE circuit, and the conversion circuit includes a replica feedback loop circuit and a CML to CMOS converter. The replica feedback loop circuit includes a first inverter having a switching threshold voltage and is configured to generate a bias voltage based on the switching threshold voltage of the first inverter. An input terminal of the first inverter is electrically connected to an output terminal of the first inverter. The CML to CMOS converter is coupled to the replica feedback loop circuit and is configured to convert a CML signal to a CMOS voltage based on the bias voltage. The CML to CMOS converter includes a second inverter having a switching threshold voltage that is same as the switching threshold voltage of the first inverter of replica feedback loop circuit. The bias voltage is configured to set a common-mode (CM) voltage that is input to the second inverter of the CML to CMOS converter to be same as the switching threshold voltage of the second inverter.

In some embodiments, a conversion method of a conversion circuit comprising a replica feedback loop circuit and a current mode logic (CML) to complementary metal oxide semiconductor (CMOS) converter is introduced. The conversion method includes steps of generating, by the replica feedback loop circuit, a bias voltage (PBIAS) based on a switching threshold voltage of a first inverter, wherein an input terminal of the first inverter is electrically connected to an output terminal of the first inverter; and converting, by the CML to CMOS converter, a CML signal to a CMOS voltage based on the bias voltage, wherein the CML to CMOS converter comprises a second inverter (2231/2232) having a switching threshold voltage that is same as the switching threshold voltage (VTH) of the first inverter of replica feedback loop circuit. The bias voltage is configured to set a common-mode (CM) voltage that is input to the second inverter of the CML to CMOS converter to be same as the switching threshold voltage of the second inverter.

According to embodiments of the disclosure, a conversion circuit includes a replica feedback loop circuit and a CML to CMOS converter. The replica feedback loop circuit of a conversion circuit includes a first inverter, in which an input terminal of the first inverter is shorted to an output terminal of the first inverter, so that an output voltage of the first inverter is equivalent to a switching threshold voltage of the first inverter. The replica feedback loop circuit further includes a first-stage amplifier and a second-stage amplifier. The second-stage amplifier of the replica feedback loop circuit is a replica of a half of a differential amplifier of the CML to CMOS converter. The replica feedback loop circuit is configured to generate a bias voltage that is used to bias the differential amplifier of the CML to CMOS converter, such that a common mode (CM) voltage outputted by the differential amplifier is same as a switching threshold voltage of a second inverter of the CML to CMOS converter. Since the CM voltage that is inputted to the second inverter is same as the switching threshold voltage of the second inverter of the CML to CMOS converter, the conversion circuit may convert the CML signal to the CMOS signal with high gain and low jitter. Moreover, a resistor is coupled in parallel to the second inverter of the CML to CMOS converter, as to enhance bandwidth of the second inverter.

DESCRIPTION OF THE EMBODIMENTS

Figure 1:
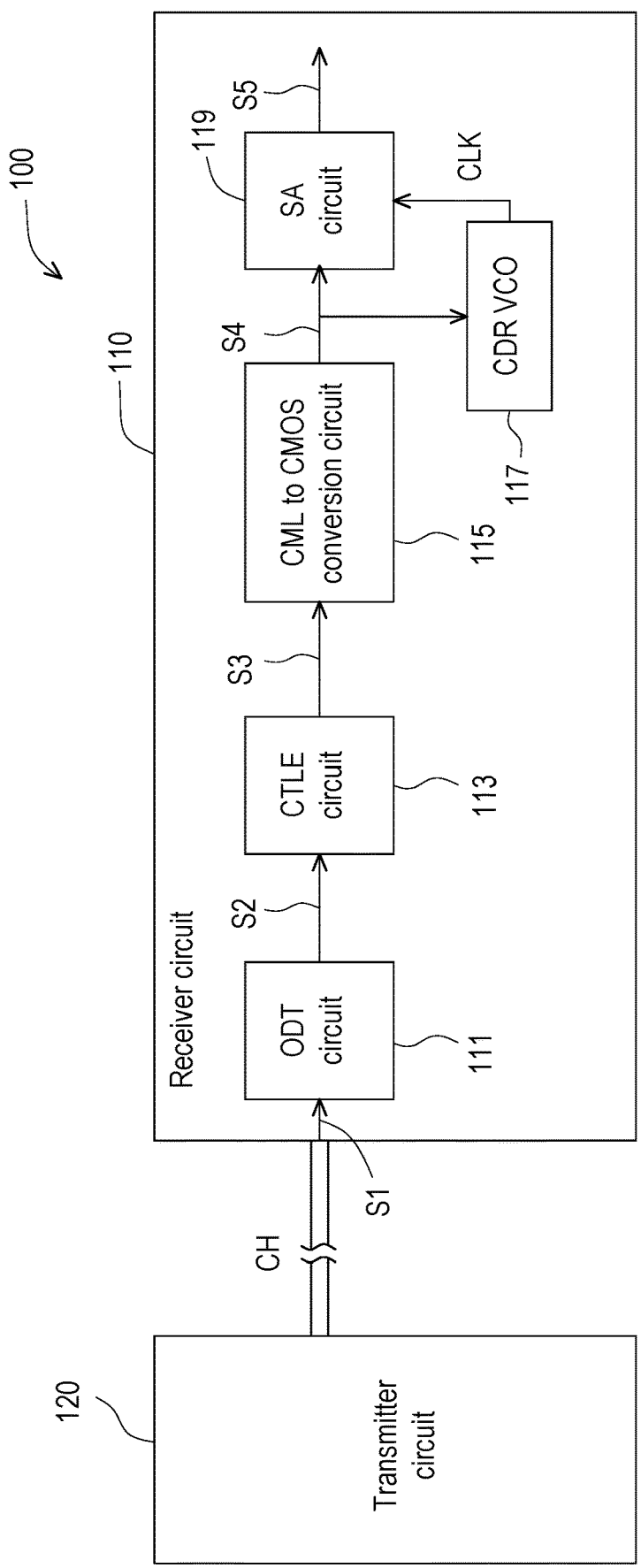
FIG. 1 is a schematic diagram illustrating a system including a transmitter circuit and a receiver circuit in accordance with some embodiments.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a schematic diagram of a system 100 including a receiver circuit 110 and a transmitter circuit 120 in accordance with some embodiments. The transmitter circuit 120 may transmit a signal S1 to the receiver circuit 110 via a channel CH. The receiver circuit 110 may include an on-die termination (ODT) circuit 111, a continuous time linear equalization (CTLE) circuit 113, a CML to CMOS conversion circuit 115, a clock and data recovery (CDR) voltage-controlled oscillator (VCO) 117 and a sampling circuit 119. The ODT circuit 111 may receive the signal S1 from the transmitter circuit 120 and calibrate an impedance of the ODT circuit 111 to match an impedance of a transmission line of the channel CH, so as to minimize a signal reflection and enhance signal integrity of the received signal. The ODT circuit 111 is configured to generate a signal S2 and output the signal S2 to the CTLE circuit 113. The CTLE circuit 113 may equalize a frequency response of the signal S2 to reduce distortions resulting from channel CH to generate a CML signal S3, and then output the CML signal S3 to the CML to CMOS conversion circuit 115. The CML to CMOS conversion circuit 115 is configured to convert the CML signal S3 to a CMOS signal S4. In some embodiments, the receiver circuit 110 may operate in a clock and data recovery (CDR) burst mode, in which the CML signal S3 is converted to the CMOS signal S4 and is directly inputted to the CDR VCO 117. The CDR VCO 117 is coupled to the CML to CMOS conversion circuit 115 to receive the CMOS signal S4, and is configured to output a clock signal CLK based on the CMOS signal S4. The sampling circuit 119 is coupled to the CML to CMOS conversion circuit 115 and the CDR VCO 117, and is configured to sample the CMOS signal S4 based on the clock signal CLK to generate output signal S5.

Figure 2:
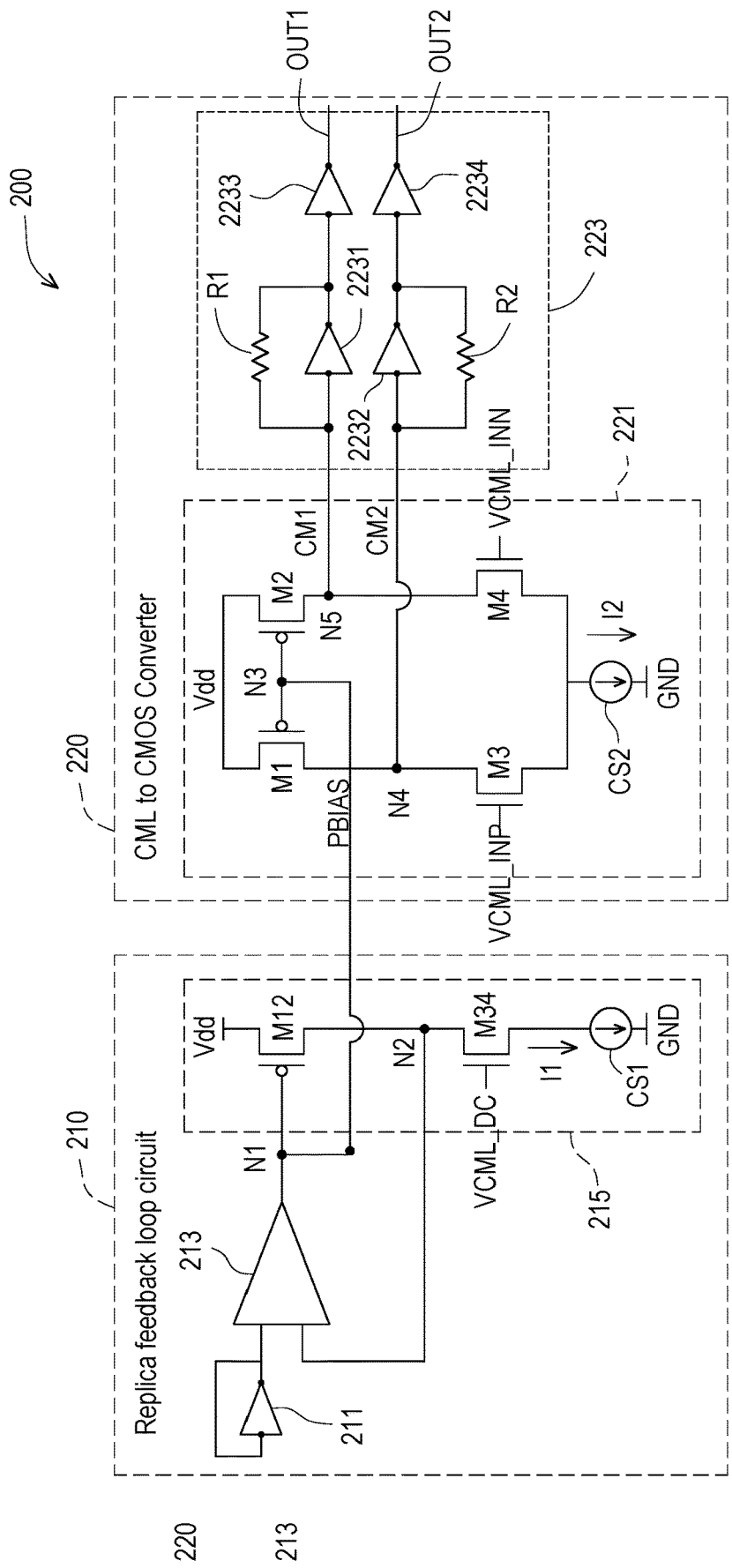
FIG. 2 is a schematic diagram illustrating a CML to CMOS conversion circuit in accordance with some embodiments.

FIG. 2 illustrates a schematic diagram of a CML to CMOS conversion circuit 200 in accordance with some embodiments. The CML to CMOS conversion circuit 200 in FIG. 2 may be same as the CML to CMOS conversion circuit 115 of the receiver circuit 110 in FIG. 1. The CML to CMOS conversion circuit 200 may include replica feedback loop circuit 210 and a CML to CMOS converter 220 that is coupled to the replica feedback loop circuit 210.

Figure 3:
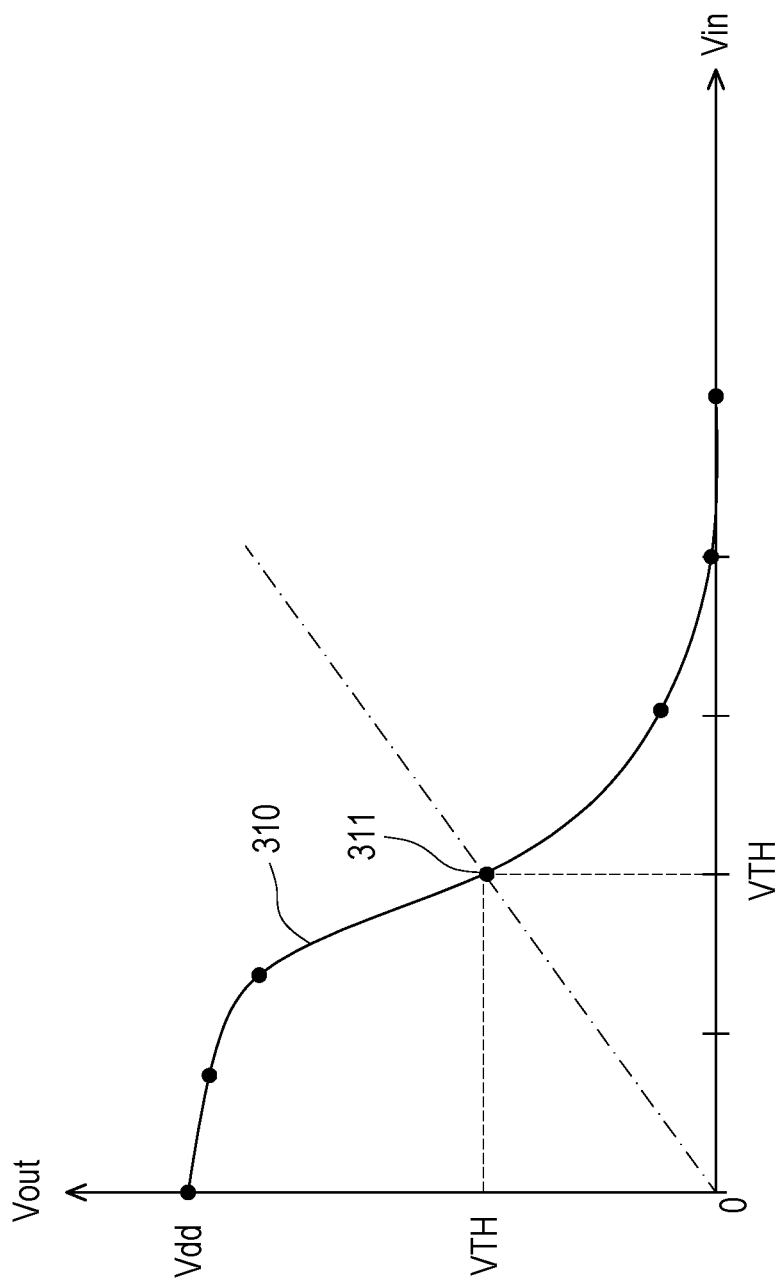
FIG. 3 is a diagram illustrating a voltage transfer characteristic curve of an inverter in accordance with some embodiments.

The replica feedback loop circuit 210 may include a first inverter 211, a first-stage amplifier 213 and a second-stage amplifier 215. The first inverter 211 includes an input terminal and an output terminal, in which the input terminal of the first inverter 211 is electrically coupled to the output terminal of the first inverter 211. Because the input terminal and the output terminal of the first inverter 211 are shorted, an output voltage of the first inverter 211 is substantially same as a switching threshold voltage VTH of the first inverter 211. The switching threshold voltage of an inverter, such as the first inverter 211, is defined as a point in a voltage transfer characteristic curve of the inverter where an input voltage is same as an output voltage. The voltage transfer characteristic curve of the inverter represents a relation between the input voltage and the output voltage of the first inverter. FIG. 3 illustrates an example of a voltage transfer characteristic curve 310 of an inverter in accordance with some embodiments. The vertical axis of the diagram in FIG. 3 illustrates the output voltage Vout of the inverter, and the horizontal axis of the diagram in FIG. 3 illustrates the input voltage Vin of the inverter. As shown in FIG. 3, the switching threshold voltage of the inverter is defined by the point 311 in the voltage transfer characteristic curve 310 where the input voltage is equal to the output voltage. A voltage level of the switching threshold voltage VTH of an inverter may depend on a voltage level of a supply voltage Vdd and/or characteristic of electronic elements that form the inverter. For example, the inverter may include at least one transistor, and the switching threshold voltage VTH may depend on a channel width of the at least one transistor.

Referring to FIG. 2, the first-stage amplifier 213 includes a first input terminal, a second input terminal and an output terminal. The first input terminal of the first-stage amplifier 213 is coupled to the output terminal of the first inverter 211, the second input terminal of the first-stage amplifier 213 is coupled to a node N2, and the output terminal of the first-stage amplifier 213 is coupled to a node N1. The first-stage amplifier 213 receives the switching threshold voltage VTH and a feedback voltage VFB from the first and second input terminals, and is configured to compare the switching threshold voltage VTH and the feedback voltage VFB to generate a bias voltage PBIAS at the node N1. The first-stage amplifier 213 may be a differential amplifier that is configured to amplify a difference between the switching threshold voltage VTH and the feedback voltage VFB to generate a bias voltage PBIAS at the node N1.

The second-stage amplifier 215 may include a first transistor M12, a second transistor M34 and a first current source CS1. The first transistor M12 is coupled between the node N2 and a reference node that receives the power supply voltage Vdd, and a control terminal (i.e., gate terminal) of the first transistor M12 is biased by the bias voltage PBIAS. The second transistor M34 is coupled between the node N2 and the first current source CS1, and a control terminal (i.e., gate terminal) of the second transistor M34 is biased by a direct-current (DC) voltage VCML_DC. The DC voltage VCML_DC may be received from the CTLE circuit (i.e., the CTLE circuit 113 in FIG. 1). In some embodiments, the level of the DC voltage VCML_DC is determined based on the CML signals VCML_INP and VCML_INN outputted by the CTLE circuit (i.e., the CTLE circuit 113 in FIG. 1). The current source CS1 is coupled between the second transistor M34 and a reference node that receives the ground voltage GND. The current source CS1 is configured to supply a current I1 flowing through the second-stage amplifier 215 of the replica feedback loop circuit 210. In FIG. 2, the first transistor M12 is represented as a PMOS and the transistor M34 is represented as an NMOS, but the disclosure is not limited thereto.

The CML to CMOS converter 220 may include a differential amplifier 221 and an output circuit 223. The differential amplifier 221 includes transistors M1, M2, M3 and M4 and a second current source CS2. The differential amplifier 221 is biased by the bias voltage PBIAS and the differential amplifier 221 is configured to output CM voltages CM1 and CM2 via nodes N5 and N4, respectively. The transistor M1 is coupled between the node N4 and a reference node that receives the power supply voltage Vdd, the transistor M2 is coupled between the node N5 and the reference node that receives the power supply voltage Vdd, and the control terminals (gate terminals) of the transistors M1 and M2 are coupled to each other via a node N3. The node N3 is coupled to the node N1 of the replica feedback loop circuit 210 to receive the bias voltage PBIAS from the node N1. As such, the control terminals of the transistors M1 and M2 are biased by the bias voltage PBIAS.

Figure 4:
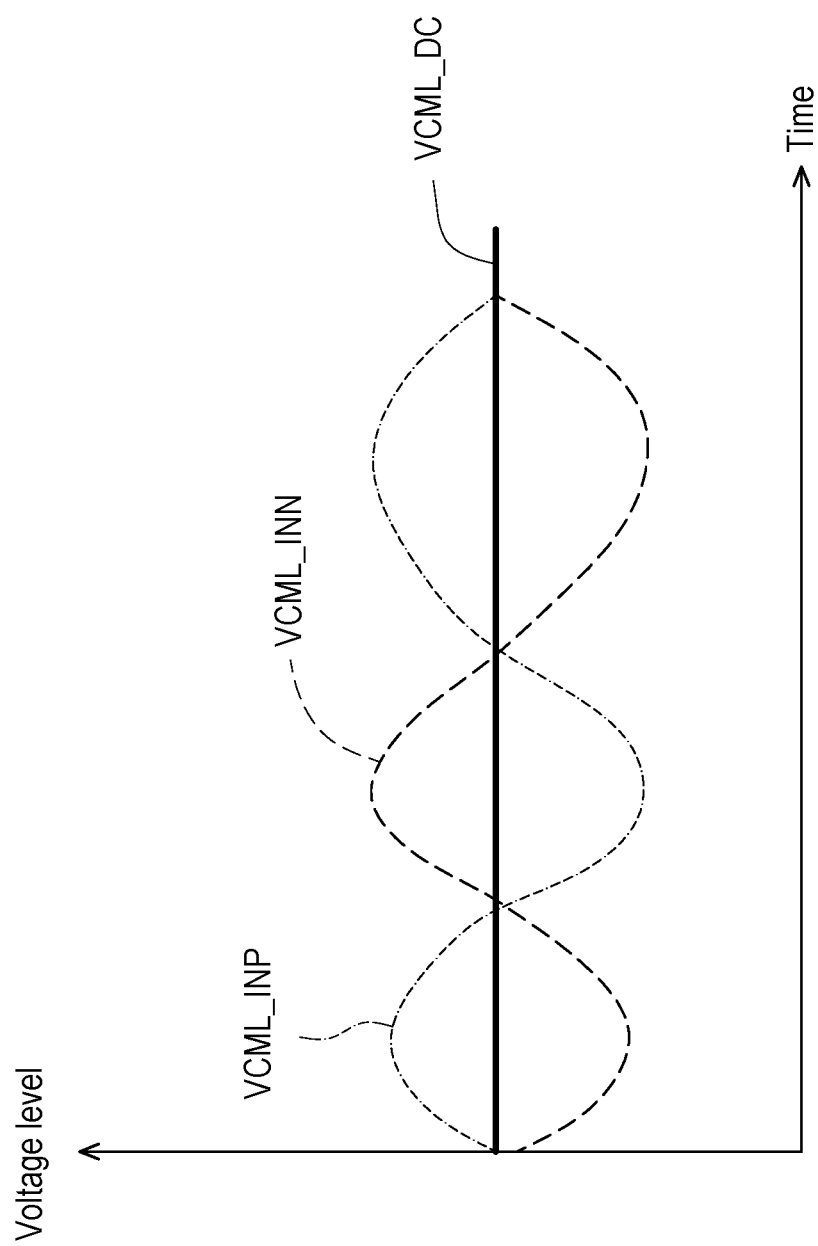
FIG. 4 is a waveform diagram of a CML signal outputted by a CTLE circuit in accordance with some embodiments.

The transistor M3 is coupled between the node N4 and the second current source CS2, the transistor M4 is coupled between the node N5 and the second current source CS2, and control terminals (gate terminals) of the transistor M3 and M4 are configured to receive CML signals VCML_INP and VCML_INN, respectively. The CML signals VCML_INP and VCML_INN may be differential signals that are outputted by a CTLE circuit (i.e., CTLE circuit 113 in FIG. 1). FIG. 4 illustrates waveforms of CML signals VCML_INP and VCML_INN outputted by the CTLE circuit in accordance with some embodiments. Referring to FIG. 4, the vertical axis of the diagram in FIG. 4 illustrates a voltage level and the horizontal axis of the diagram in FIG. 4 illustrates time. The DC component of the CML signals VCML_INP and VCML_INN is illustrated as the DC voltage VCML_DC which is inputted to the control terminal of the transistor M34.

In some embodiments, each of the transistors M3 and M4 of the differential amplifier 221 is identical to the transistor M34 of the second-stage amplifier 215, and each of the transistors M1 and M2 of the differential amplifier 221 is identical to the transistor M12 of the second-stage amplifier 215. In other words, the transistors M3, M4 and M34 have the same design, and the transistor M12, M1 and M2 have the same design.

The second current source CS2 is coupled between the transistors M3, M4 and the reference node that receives the ground voltage GND. The second current source CS2 is configured to supply a current I2 flowing through the differential amplifier 221. In some embodiments, the current I1 supplied by the first current source CS1 is a half of the current I2 supplied by the second current source I2. In this way, the second-stage amplifier 215 of the replica feedback loop circuit is a replica of a half of the differential amplifier 221 of the CML to CMOS converter 220.

In operation of the CML to CMOS conversion circuit 200, the first-stage amplifier 213 of the replica feedback loop circuit 210 is configured to compare the switching threshold voltage VTH and the feedback voltage VFB to generate a bias voltage PBIAS. When the feedback voltage VFB is greater than the switching threshold voltage VTH, the bias voltage PBIAS decreases, thereby increasing the voltage drop across the first transistor M12. The increased voltage drop across the first transistor M12 reduces the voltage at the node N2 until the voltage at the node N2 is substantially equal to the switching threshold voltage VTH. When the feedback voltage VFB is lower than the switching threshold voltage VTH, the bias voltage PBIAS increases, thereby decreasing the voltage drop across the first transistor M12. The decreased voltage drop across the first transistor M12 increases the voltage at the node N2 until the voltage at the node N2 is substantially equal to the switching threshold voltage VTH. In this way, a feedback mechanism of the replica feedback loop circuit 210 may maintain the voltage level at the node N2 at a voltage level of the switching threshold voltage VTH.

Meanwhile, the bias voltage PBIAS is also inputted to the control terminals of the transistors M1 and M3 of the differential amplifier 221. The transistors M1 and M2 of the differential amplifier 221 are controlled in a similar manner as the transistor M12, thus the detailed description regarding operations of the transistors M1 and M2 based on the bias voltage PBIAS is omitted hereafter. The feedback mechanism of the replica feedback loop circuit 210 may maintain the voltage levels of the CM voltages CM1 and CM2 at the voltage level of the switching threshold voltage VTH.

The output circuit 223 may include inverters 2231, 2233 and a resistor R1. The resistor R1 is coupled between an input terminal and an output terminal of the inverter 2231. In other word, the resistor R1 is coupled in parallel to the inverter 2231. The input terminal of the inverter 2231 is coupled to the node N5, and the output terminal of the inverter 2231 is coupled to an input terminal of the inverter 2233. The inverter 2231 may receive the CM voltage CM1 from the node N5 and invert a logic state of the CM voltage CM1. The inverter 2233 is coupled in series to the inverter 2231 and is configured to invert a logic state of a voltage outputted from the inverter 2231 to generate the CMOS output voltage OUT1.

The output circuit 223 may further include inverters 2232, 2234 and a resistor R2. The resistor R2 is coupled in parallel to the inverter 2232. The input terminal of the inverter 2232 is coupled to the node N4, and the output terminal of the inverter 2232 is coupled to an input terminal of the inverter 2234. The inverter 2232 may receive the CM voltage CM2 from the node N4 and invert a logic state of the CM voltage CM2. The inverter 2234 is coupled in series to the inverter 2232 and is configured to invert a logic state of a voltage outputted from the inverter 2232 to generate the CMOS output voltage OUT2.

In some embodiments, the switching threshold voltages of the inverters 2231 and 2232 of the CML to CMOS converter 220 is same as the switching threshold voltage VTH of the first inverter 211 of the replica feedback loop circuit 210. Since the voltage levels of the CM voltages CM1 and CM2 are same as the switching threshold voltage of the inverter 2231, the gain of the inverter 2231 is enhanced. Accordingly, the gain of the CML to CMOS conversion is enhanced and the jitter of the CML to CMOS conversion is reduced.

Furthermore, since the register R1 is coupled in parallel to the output terminal of the inverter 2231 and the register R2 is coupled in parallel to the output terminal of the inverter 2232, a bandwidth of the inverter 2231 is improved. Accordingly, the bandwidth of the CML to CMOS conversion of the CML to CMOS conversion circuit 200 is improved.

Figure 5:
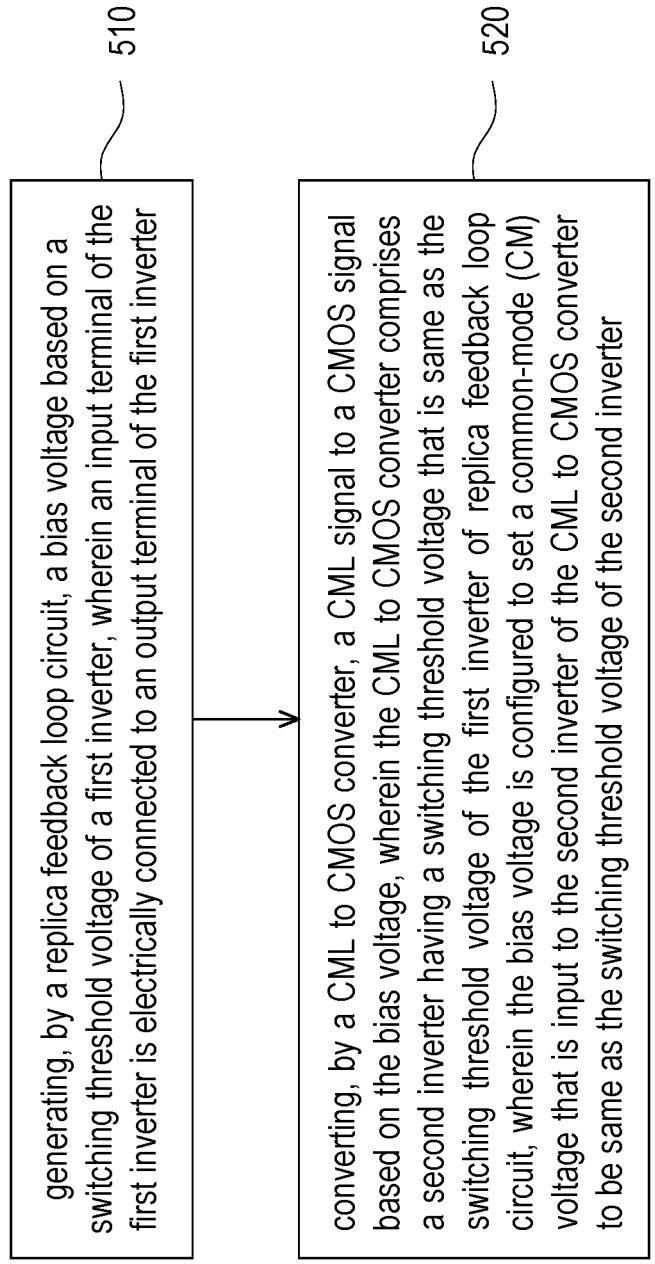
FIG. 5 is a flowchart diagram illustrating a conversion method of a conversion circuit in accordance with some embodiments.

FIG. 5 illustrates a flowchart diagram of a conversion method adapted to a conversion circuit (i.e., the CML to CMOS conversion circuit 200 in FIG. 2) in accordance with some embodiments. The CML to CMOS conversion circuit includes a replica feedback loop circuit and a CML to CMOS converter. In block 510, a replica feedback loop circuit of the conversion circuit generates a bias voltage based on a switching threshold voltage of a first inverter, wherein an input terminal of the first inverter is electrically connected to an output terminal of the first inverter. In block 520, a CML to CMOS converter of the conversion circuit is configured to convert a CML signal to a CMOS signal based on the bias voltage, wherein the CML to CMOS converter comprises a second inverter having a switching threshold voltage that is same as the switching threshold voltage of the first inverter of replica feedback loop circuit, wherein the bias voltage is configured to set a common-mode (CM) voltage that is input to the second inverter of the CML to CMOS converter to be same as the switching threshold voltage of the second inverter.

In summary, a conversion circuit includes a replica feedback loop circuit and a CML to CMOS converter. The replica feedback loop circuit of a conversion circuit includes a first inverter, in which an input terminal of the first inverter is shorted to an output terminal of the first inverter, so that an output voltage at the output terminal of the first inverter is equivalent to a switching threshold voltage of the first inverter. The replica feedback loop circuit further includes first-stage amplifier and a second-stage amplifier, and the CML to CMOS converter includes a differential amplifier. The second-stage amplifier of the replica feedback loop circuit is a replica of a half of the differential amplifier of the CML to CMOS converter. The replica feedback loop circuit is configured to generate a bias voltage that is used to bias the differential amplifier of the CML to CMOS converter, such that a common mode (CM) voltage outputted by the differential amplifier of the CML to CMOS converter is same as a switching threshold voltage of a second inverter of the CML to CMOS converter. Since the CM voltage that is inputted to the second inverter is same as the switching threshold voltage of the second inverter of the CML to CMOS converter, the conversion circuit may convert the CML signal to the CMOS signal with high gain and low jitter. Moreover, a resistor is coupled in parallel to the second inverter of the CML to CMOS converter. In this way, the CML to CMOS converter achieves high bandwidth.

Although the embodiment of the disclosure has been described in detail, the disclosure is not limited to a specific embodiment and various modifications and changes are possible within the scope of the disclosure disclosed in the claims.

What is claimed is:

1. A conversion circuit, comprising:
   a replica feedback loop circuit, comprising a first inverter having a switching threshold voltage, configured to generate a bias voltage based on the switching threshold voltage of the first inverter, wherein an input terminal of the first inverter is electrically connected to an output terminal of the first inverter; and
   a current mode logic (CML) to complementary metal oxide semiconductor (CMOS) converter, coupled to the replica feedback loop circuit, configured to convert a CML signal to a CMOS signal based on the bias voltage, wherein the CML to CMOS converter comprises a second inverter having a switching threshold voltage that is same as the switching threshold voltage of the first inverter of replica feedback loop circuit,
   wherein the bias voltage is configured to set a common-mode (CM) voltage that is input to the second inverter of the CML to CMOS converter to be same as the switching threshold voltage of the second inverter.

2. The conversion circuit of claim 1, wherein
   the first inverter is configured to output a voltage which is equal to the switching threshold voltage to the output terminal of the first inverter, and
   the switching threshold voltage of the first inverter is determined according to a voltage transfer characteristic curve that represents a relation between an input voltage of the first inverter and an output voltage of the first inverter.

3. The conversion circuit of claim 2, wherein the replica feedback loop circuit further comprises:
   a first-stage amplifier, configured to compare the switching threshold voltage of the first inverter with a feedback voltage; and
   a second-stage amplifier, coupled to the first-stage amplifier via a first node, wherein the second-stage amplifier comprises:
   a first transistor, wherein a control terminal of the first transistor is coupled to the first node;
   a second transistor, coupled to the first transistor in series via a second node, wherein a control terminal of the second transistor receives a direct current voltage; and
   a current source, coupled to the second transistor in series, configured to supply a first current flowing through the second-stage amplifier.

4. The conversion circuit of claim 3, wherein the second-stage amplifier is configured to provide the feedback voltage to the second input terminal of the first-stage amplifier via the second node.

5. The conversion circuit of claim 4, wherein the CML to CMOS converter comprises:
   a differential amplifier, wherein the differential amplifier comprises:
   a first differential transistor;
   a second differential transistor, wherein a control terminal of the first differential transistor is coupled to a control terminal of the second differential transistor via a third node, and the third node is coupled to the first node to receive the bias voltage from the replica feedback loop circuit;
   a third differential transistor, coupled to the first differential transistor via a fourth node, wherein a control terminal of the third differential transistor receives a first CML signal;
   a fourth differential transistor, coupled to the second differential transistor via a fifth node, wherein a control terminal of the fourth differential transistor receives a second CML signal; and
   a second current source, coupled to the third differential transistor and the fourth transistor, configured to supply a second current to the differential amplifier,
   wherein the differential amplifier is configured to generate a first CM voltage and a second CM voltage, and the differential amplifier is further configured to output the first CM voltage and the second CM voltage to the fifth node and the fourth node, respectively.

6. The conversion circuit of claim 5, wherein
   the CML signal comprises the first CML signal and the second CML voltage, and
   a first current generated by the first current source is a half of a second current generated by the second current source.

7. The conversion circuit of claim 5, wherein the CML to CMOS converter further comprises an output circuit, and the output circuit comprises:
   the second inverter, coupled to the fifth node to receive the first CM voltage, configured to invert the first CM voltage, wherein the first CM voltage is same as the switching threshold voltage of the second inverter;
   a first resistor, coupled in parallel to the second inverter; and
   a third inverter, coupled in series to an output terminal of the second inverter, configured to invert a voltage outputted from the second inverter to generate a first CMOS output voltage.

8. The conversion circuit of claim 7, wherein the CML to CMOS converter further comprises an output circuit, and the output circuit further comprises:
   a fourth inverter, coupled to the fourth node to receive the second CM voltage, configured to invert the second CM voltage, wherein the second CM voltage is same as the switching threshold voltage of the fourth inverter;
   a second resistor, coupled in parallel to the fourth inverter; and a fifth inverter, coupled in series to an output terminal of the fourth inverter, configured to invert a voltage outputted from the fourth inverter to generate a second CMOS output voltage.

9. The conversion circuit of claim 8, wherein
the switching threshold voltage of the first inverter is same as the switching threshold voltage of the second inverter, and
the threshold voltage of the second inverter is same as the switching threshold voltage of the fourth inverter.

10. A conversion method of a conversion circuit comprising a replica feedback loop circuit and a current mode logic (CML) to complementary metal oxide semiconductor (CMOS) converter, the conversion method comprising:
generating, by the replica feedback loop circuit, a bias voltage based on a switching threshold voltage of a first inverter, wherein an input terminal of the first inverter is electrically connected to an output terminal of the first inverter; and
converting, by the CML to CMOS converter, a CML signal to a CMOS signal based on the bias voltage, wherein the CML to CMOS converter comprises a second inverter having a switching threshold voltage that is same as the switching threshold voltage of the first inverter of replica feedback loop circuit,
wherein the bias voltage is configured to set a common-mode (CM) voltage that is input to the second inverter of the CML to CMOS converter to be same as the switching threshold voltage of the second inverter.

11. The conversion method of claim 10, further comprising:
outputting, by the first inverter of the replica feedback loop circuit, a voltage which is equal to the switching threshold voltage to the output terminal of the first inverter,
wherein the switching threshold voltage of the first inverter is determined according to a voltage transfer characteristic curve that represents a relation between an input voltage of the first inverter and an output voltage of the first inverter.

* * * * *